(12) United States Patent
Sun (10) Patent No.: US 6,993,407 B2
(45) Date of Patent: Jan. 31, 2006

(54) METHOD AND SYSTEM FOR ANALYZING SEMICONDUCTOR FABRICATION

(75) Inventor: Cheng I. Sun, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 88 days.

(21) Appl. No.: 10/677,929

(22) Filed: Oct. 2, 2003

(65) Prior Publication Data

US 2005/0075750 A1 Apr. 7, 2005

(51) Int. Cl.
*G06F 19/00* (2006.01)

(52) U.S. Cl. ...................................... 700/121; 700/108
(58) Field of Classification Search ................. 700/121, 700/108; 438/689
See application file for complete search history.

(56) References Cited

U.S. PATENT DOCUMENTS

| | | | | |
|---|---|---|---|---|
| 5,064,605 | A * | 11/1991 | Ruddy et al. | 376/247 |
| 6,616,759 | B2 * | 9/2003 | Tanaka et al. | 118/63 |
| 2002/0085212 | A1 * | 7/2002 | Campbell et al. | 356/600 |
| 2004/0148049 | A1 * | 7/2004 | Schwarm | 700/121 |

OTHER PUBLICATIONS

Shu–Kai S et al., "Sisco Run–To–Run Controller Using Tripple EWMA Smoothing," pp. 1–9, Taiwan.
Telfeyan et al., "A Multi–Level Approach To The Control Of A Chemical–Mechanical Planarization Process," pp. 1–20, U.S.A.
Telfeyan et al., Demonstration Of A Process–Independent Run–To–Run Controller, pp. 1–11. U.S.A.
Herzog et al., Preconditions And Strategies For Successful Implementation Of Advanced Process Control On A Large Scale, pp. 83–88, Germany.Tsakalis et al., "The Role of Dead–Zones In Improving Run–To–Run Control Performance," pp. 1–15, AEC/APC Symposium XI, Vail, Sep. 12–17, 1999, U.S.A.

(Continued)

*Primary Examiner*—Leo Picard
*Assistant Examiner*—Alexander J Kosowski
(74) *Attorney, Agent, or Firm*—Duane Morris LLP (57) ABSTRACT

A method and a system for analyzing a semiconductor manufacturing process includes a semiconductor manufacturing process that can generate sets of input and output data. Principal components are generated from the set of input data, and a set of principal component score data are determined based on the principal components. A relationship between the sets of input and output data is determined from the principal component score data and the output data. The system includes at least one storage device and a processor. The storage device stores input data and output data from the semiconductor manufacturing process. The processor is coupled to the storage device. The processor determines principal components from the input data, a set of principal component score data based on the principal components, and a relationship between the input and output data from the principal component score data and the output data.

35 Claims, 3 Drawing Sheets

OTHER PUBLICATIONS

Hardt et al., "Cycle To Cycle Manufacturing Process Control," pp. 1–9, U.S.A.

Campbell et al., "Run–To–Run Control of Photolithography Processes", pp. 1–6, Jul. 1. 2001, Future Fab vol. 10, KLA–Tencor, U.S.A., http://www.future–fab.com/documents asp2d ID=1152 cited May 15, 2003.

Moyne, "Run By Run Control: Interfaces, Implementation, and Integration,", pp. 1–2, Feb. 1995, CIDM Memo 95–12, Last Updated Nov. 6, 1996, U.S.A., http://www–mtl mit edu/CIDM/memos/95–12/95–12 html cited May 15, 2003.

Chapter 3, "Principal Components Analysis," pp. 1–41, U.S.A.

Chapter 3, "Principal Components," pp. 458–485, U.S.A.

Crow, Improving Overlay Performance In Lithography Tools Using Run–To–Run Control, New Vision Systems, pp. 1–13, U.S.A., http://www micromagazine com/archive/03/01/crow html cited May 15, 2003.

Baliga, Advanced Process Control: Soon To Be A Must, Semiconductor International Jul. 1999, pp. 1–9, U.S.A.

Moyne et al., Project M6: RMS In The Semiconductor Industry, pp. 1–2, U.S.A., http://erc.engin,umich.edu/M6.htm, cited May 15, 2003.

Moyne et al., Run–To–Run Control, Updated: Friday Apr. 21, 2000, U.S.A., http://www.eecs.umich.edu/~impact/Research/R2R.html, cited May 15, 2003.

Principal Component Analysis (tutorial), pp. 1–2, Mar. 23, 1999, U.S.A., http://www.fon.hum.uva.nl/praat/manual.Principal_component_analysis.html, cited Jun. 6, 2003.

6.5.5.1. "Properties Of Principal Components," Engineering Statistics Handbook, pp. 1–7, U.S.A., http://www.itl.nist.gov/div898/handbook/pmc/section5/pmc551.htm, cited Jun. 10, 2003.

HyperStat Online Contents, "Computing Pearson's Correlation Coefficient," pp. 1–2, U.S.A., http://davidmlane.com/hyperstat.A51911.html, cited Jun. 13, 2003.

TexaSoft's Statistics Tutorial—"Pearsons Correlation Coefficient," pp. 1–3, Copyright TexaSoft, 1996–2001, U.S.A., http://www.texasoft.com/winkpear.html, cited Jun. 13, 2003.

Component Scores & Their Uses, pp. 1–3.

* cited by examiner

METHOD AND SYSTEM FOR ANALYZING SEMICONDUCTOR FABRICATION

BACKGROUND

The present invention relates to a method and a system for analyzing a semiconductor fabrication process. More particularly, the present invention relates to a method and a system for analyzing a thermal diffusion process within semiconductor fabrication.

Chemical vapor deposition (CVD) is a process for forming thin film layers within the semiconductor integrated circuit fabrication. Usually, it includes atmospheric pressure and low pressure chemical vapor deposition (APCVD and LPCVD). By the process, silicon nitride, silicon oxide and polysilicon layers are formed on a silicon wafer substrate. In LPCVD, the process is carried out at a pressure below 100 Torr. Due to the low pressure, the thin film layers have good qualities and better step coverage for semiconductor fabrication. Typically, wafers are placed in a vertical or horizontal furnace where they are heated and brought to a low pressure state. A reaction gas is introduced into the furnace, and reaction material is deposited on the substrate either by reaction or by thermal decomposition of the reaction gas.

Figure 1:
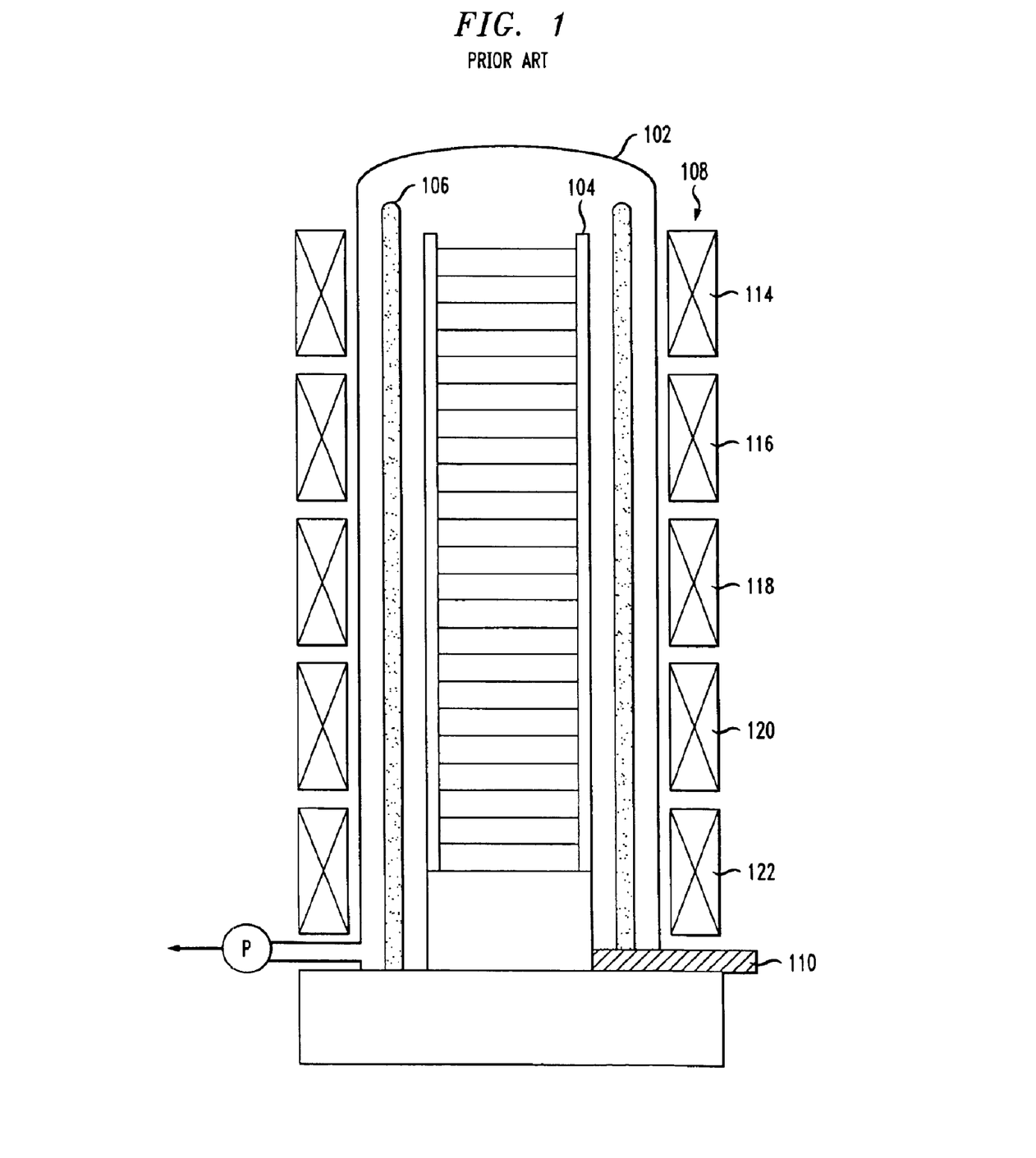
FIG. 1 illustrates a schematic cross-sectional structure of a furnace for fabricating semiconductor integrated circuits.

FIG. 1 is a schematic cross-sectional view of a conventional vertical LPCVD furnace. As shown in FIG. 1, the LPCVD furnace is a hot-wall reaction type tool for thin film deposition. The reactor is a quartz tube 102. Outside and surrounding the quartz tube 102 are a group of heating elements 108 for heating up the furnace. Since the group of heating elements 108 have five sections, the group of heating elements 108 is also called a five-zone heater. A vacuum pump P removes gas from the reactor. Reaction gases from outside pass into the reaction chamber through a gas injector 110. The wafers waiting for thin film deposition are loaded on a quartz boat 104. By this tool, a thin film layer, such as silicon nitride, silicon oxide and polysilicon or the like is deposited on the wafers.

Generally, the chemical deposition rate depends on temperature, pressure or flow rates of reaction gases. It is difficult to produce a thin film layer having a uniform thickness on the wafers from the bottom to the top of the furnace. For the five-zone heater, the furnace is divided into three regions, top, center and bottom. Usually different regions will form thin film layers with different thicknesses even though the thickness to be formed ideally is same. As a result, adjusting the temperatures for each heating element to form a thin film layer having uniform thickness is required. However, the adjustments of temperature are very individualized and cannot be determined by a simple rule. For example, when the heating element 120 is adjusted to enhance or inhibit the reaction at the bottom region, the heating elements 118 and 122 are adjusted as well. Because of the unpredictable reaction in the furnace, sometimes the heating element 114 or 116 affects the deposition reaction at the bottom region more serious than the heating element 118 or 122.

Accordingly, it is desirable to propose a method and a system to control the temperature adjustments for each heating element in order to form a thin film layer with a uniform thickness.

SUMMARY

A method for analyzing a semiconductor manufacturing process is provided. The method includes first generating sets of input and output data generated from the semiconductor manufacturing process. Then principal components and a set of principal component score data are determined from the set of input data. A relationship between the sets of input and output data is determined from the set of principal component score data and the set of output data.

A system for analyzing a thermal diffusion process in a vertical or horizontal furnace is provided. The system includes a storing means and a processor coupled to the storing means. The storing means is used for storing sets of input data and output data from the semiconductor manufacturing process. The processor is used to determine principal components, a set of principal component score data from the sets of input data, and a relationship between the sets of input and output data from the set of principal component score data and the set of output data.

DESCRIPTION OF THE PREFERRED EMBODIMENT

Figure 2:
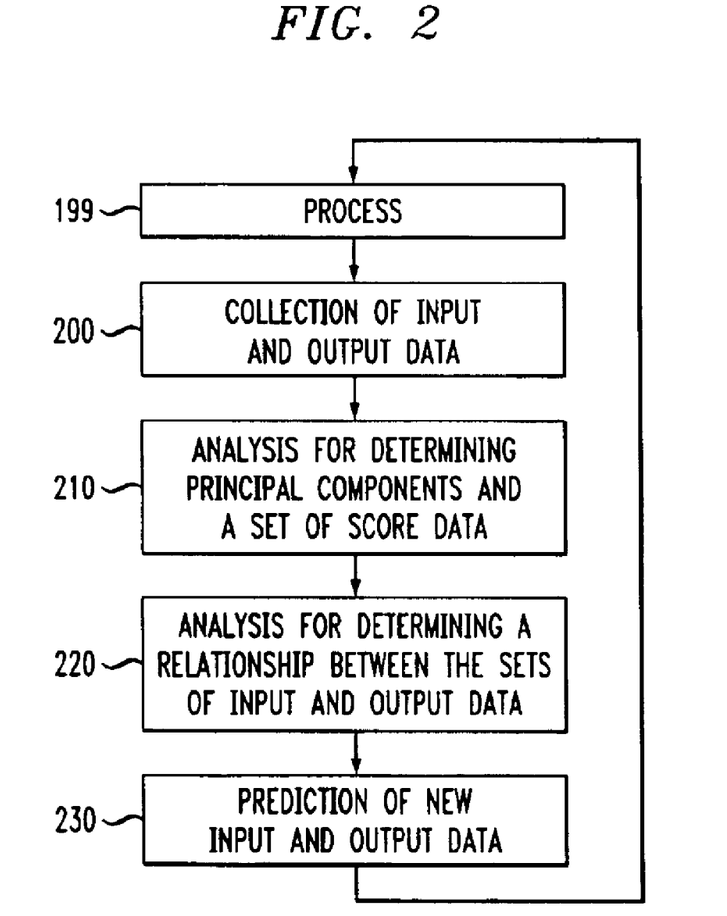
FIG. 2 illustrates a flowchart showing one exemplary embodiment for analyzing a semiconductor manufacturing process in accordance with the present invention.

FIG. 2 illustrates a flowchart showing one exemplary embodiment for analyzing a semiconductor manufacturing process. As shown in FIG. 2, a semiconductor manufacturing process generates first sets of input and output data that are stored in a collection step 200. The first analysis step 210 determines principal components and a set of principal component score data. A second analysis step 220 determines a relationship between the sets of input and output data from the set of principal component score data and the set of output data in. Finally, a prediction step 230 determines sets of new input and output data for subsequent processes.

At step 199 a semiconductor manufacturing process is performed to create a set of output data from a set of input data. The semiconductor manufacturing process can be, for example, a thin film formation process, a photolithographic process, an etching process, a thermal diffusion process, or any other semiconductor manufacturing process.

The collection step 200 stores sets of input and output data generated from the semiconductor manufacturing process. The set of input data can be, for example, temperature, pressure, gas flow rate, or any other factors that affect the manufacturing process. The set of output data can be any outcome generated from the manufacturing process, such as thickness of a thin film layer. The sets of input and output data can be, for example, randomly selected from a large data base or selected by design of experiment (DOE). One of ordinary skill in the art understands that the accuracy of the relationship between the sets of input and output data depends on whether DOE is utilized at the step 200 or whether proper DOE data are applied to find out the relationship between the sets of input and output data. For example, if the accuracy of the relationship between the sets of input and output data is not very important, DOE can be ignored and the operation time for analyzing the manufacturing process can be saved.

In some embodiments, the set of input data are normalized which serve for generating eigenvalues (the principal values, or roots of the characteristic equation of a matrix) and eigenvectors for the subsequent analysis steps. (In linear algebra, the eigenvectors of a linear operator are non-zero vectors which, when operated on by the operator, result in a scalar multiple of themselves. The scalar is then called the eigenvalue associated with the eigenvector.) However, there is no requirement that the normalization of the input data be performed. In some embodiments, the row data can serve for generating eigenvalues and eigenvectors for the subsequent analysis steps.

In some embodiments of a thermal diffusion process, the set of input data are temperature differences between a theoretical temperature and a real temperature of the thermal diffusion process for each temperature zone of a vertical or horizontal furnace. In these embodiments, the set of output data can be, for example, thickness differences of a thin film layer between a theoretical thickness and a real thickness fabricated by the thermal diffusion process in different regions of the furnace. One of ordinary skill in the art can understand how to choose any other input and output factors that will affect an interaction during a process in accordance with the exemplary embodiments.

After the set of input and output data are collected, the first analysis step 210 can determine principal components that dominate the reaction of the process from the set of input data. In some embodiments, the first analysis step 210 is used for determining principal components by applying Principal Component Analysis (PCA). From PCA, the components that are not significant can be removed, and subsequent steps used to find out the relationship between the sets of input and output data can be simplified.

Generally PCA can generate sets of eigenvalues and eigenvectors from the set of input data. The sets of eigenvalues and eigenvectors represent a relationship between the principal components and the original input data. Moreover, the eigenvalues of each component indicate how much variance it accounts for or how significant the component is. The larger the eigenvalues of the component, the more significant the component is to the reaction of the process. Based on the eigenvalues, some components not significant to the process are removed or ignored. One of ordinary skill in the art will understand that the removal of some insignificant components depends on the requirement of accuracy of the relationship between the sets of input and output data. For example, if the difference between two components is by several orders of magnitude, the smaller one may be ignored in the subsequent steps. However, there must be at least one component for the following operation.

Then the relationship between the principal components and the input data can generate a set of principal component scores. From the eigenvalues and eigenvectors generated from PCA, a linear relationship between principal components and the set of input data can be determined as shown in equation (1):

$$\text{Prin } X = a_1 \Delta t_1 + a_2 \Delta t_2 + a_3 \Delta t_3 + a_4 \Delta t_4 + a_5 \Delta t_5 \quad (1)$$

where Prin X indicates different principal components; $a_1$, $a_2$, $a_3$, $a_4$ and $a_5$ are parameters of the relationship between the principal components and the set of input data; and $\Delta t_1$, $\Delta t_2$, $\Delta t_3$, $\Delta t_4$ and $\Delta t_5$ are the input data. In some embodiments of thermal diffusion, the set of input data are differences of each temperature zone.

After the linear relationships are generated, the set of principal component scores are created by multiplying the parameters, i.e. $a_1$, $a_2$, $a_3$, $a_4$ and $a_5$, with the set of input data. By of the set of principal component scores, the second analysis step 220 can determine a relationship between the sets of input and output data from the principal component scores and the set of output data.

In these embodiments of the thermal diffusion process, the principal component scores are combined with the set of output data, such as the thickness difference between the theoretical thickness and the real thickness of a thin film layer created in different regions of a vertical or horizontal furnace. Then the second analysis step 220 can determine the relationship between the principal components and the set of output data by a regression model. In some embodiments, the regression model is, for example, a linear or polynomial regression model or any other method that can substantially perform the same function of the regression model. Accordingly, regression model can determine a relationship between the principal components and the set of output data. The relationship is represented by sets of eigenvalues and eigenvectors created from the regression model. In some embodiments wherein a linear regression model is applied, the relationship between the principal components and the output data can be generated below as equation (2):

$$\Delta yi = c + \sum_i c_i * \text{Prin } X \quad (2)$$

where $\Delta yi$ is the set of output data; Prin X are the principal components; c and $c_1$ are parameters showing the relationship between the principal components and the set of output data.

It will be understood that the method used in the second analysis step 220 depends on, for example, how accurate the relationship between the sets of input and output data is required. Therefore, one of ordinary skill in the art may use any other method to perform the same function of the second analysis step 220.

Finally, a relationship between the sets of input and output data is generated by multiplying equation (1) with equation (2). In the exemplary embodiments of thermal diffusion, the relationship between temperature differences of each temperature zone and the thickness variations of the thin film layer formed by the process is created. Finally, the collection step 200, the first analysis step 210 and the second analysis step 220 can generate the relationship between the sets of input and output data.

From the relationship between the input and output data, a prediction step 230 can determine sets of new input and output data. Then the set of new input data can be fed back to the semiconductor manufacturing process. One of ordinary skill in the art can understand that whether the feed-back operation is required depends on the stability of the manufacturing process. For example, if the process is so stable that the process can be run by the original input data, the prediction step 230 may not be required.

Figure 3:
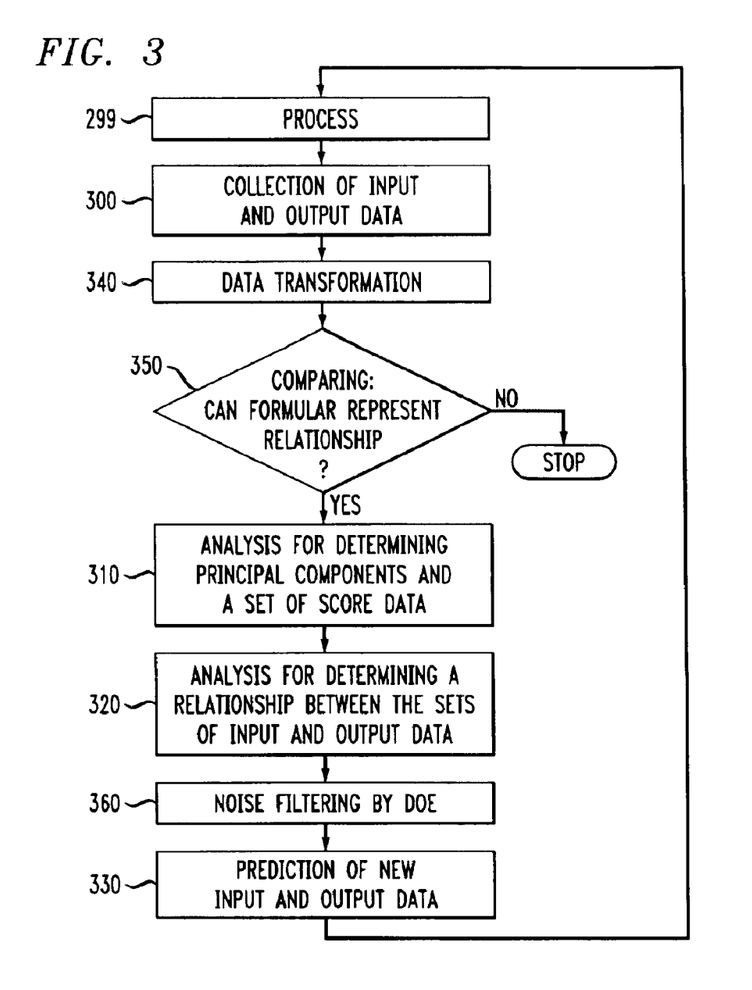
FIG. 3 illustrates a flowchart showing another exemplary embodiment for analyzing a semiconductor manufacturing process in accordance with the present invention.

FIG. 3 illustrates a flowchart showing another exemplary embodiment for analyzing a semiconductor manufacturing process. The embodiment includes all steps mentioned in FIG. 2 and three additional steps: a transforming step 340, a comparing step 350, and a noise filtering step 360.

Items in FIG. 3 that are the same as items in FIG. 2 are indicated by reference numerals that are increased by 100. They include a process step 299, a collection step 300, first analysis step 310, second analysis step 320 and prediction step 330. Detailed descriptions of each of these items are not repeated.

In some embodiments, the transforming step 340 and the comparing step 350 can determine whether a formula of a physical or chemical model can represent the relationship between the input and output data of the manufacturing process. The transforming step 340 and the comparing step 350 can be, for example, between the collection step 300 and the first analysis step 310. There is no requirement when the transforming step 340 and the comparing step 350 should be applied. But it is more advantageous when they are applied at the beginning of the operation for determining whether the formula of the model is suitable for the process.

The transforming step 340 can transform the sets of input and output data into other sets of input and output data by a physical or chemical model. In some embodiments of thermal difflusion, an Arrhenius model can be used to transform the sets of input and output data. The Arrhenius model is described in equation (3):

$$k = A^* exp(-E_a/RT) \quad (3)$$

where k is a rate coefficient, $A^*$ is a constant, $E_a$ is an activation energy, R is a universal gas constant and T is temperature. Moreover, logarithms can transform equation (3) into equation (4):

$$ln\ k = ln\ A^* - E_a/RT \quad (4)$$

The comparing step 350 can compare the sets of input and output data with the transformed input and output data, and determine whether a formula of a physical or chemical model can represent the relationship between the input and output data of the manufacturing process. When differences between the set of input and output data and the transformed input and output data are very obvious, the formula of the physical or chemical model is not suitable for determining the relationship between the sets of input and output data. For example, a set of original data are transformed into another set of data by a model. When the differences between the original and transformed data are by one or more orders of magnitude, but the numbers of the original and transformed data do not vary, the formula of the physical or chemical model is assumed to be suitable for determining the relationship between the input and output data of the manufacturing process. In the embodiments of thermal diffusion, if the set of input data and set of transformed data by the Arrhenius model have the results similar to those mentioned above, equation (4) can be a suitable model to determine the relationship between the sets of input and output data. If no chemical or physical model is suitable to transform the original set of data into another set of data that meets the requirement mentioned above, the subsequent operation steps are not required.

One of ordinary skill in the art understands that the data comparing is not necessarily required if a physical or chemical model of a process reaction comprises a mathematical equation therein. For example, because the equation (3) of the Arrhenius model is a linear formula, the relationship between the sets of input and output data of a thermal diffusion process can be assumed similar to the type of equation (3).

In some embodiments, after the second analysis step 320 and prior to the prediction step 330, the noise filtering step 360 is applied.

The noise filtering step 360 can remove some noise within the sets of input and output data. The noise filtering step 360 can be performed, for example, by DOE. As mentioned above, if the sets of input and output data are collected randomly, they usually include some data noise. By the noise filtering step 360, for example, sets of input and output data generated from DOE can create a more accurate relationship between the sets of input and output data. However, if the collection step includes generating the sets of input and output data by the DOE method, it is possible that the noise filtering step 360 is not required. Nevertheless, the noise filtering step 360 can determine whether the sets of input and output data are properly selected even if the sets of input and output data are generated by DOE.

There is no requirement that all of the transforming step 340, comparing step 350 and the noise filtering step 360 be applied to find out the relationship between the input and output data. One of ordinary skill in the art, after reviewing the exemplary embodiments, will understand that they are optional, but it is more advantageous if the exemplary embodiments can include these steps.

Figure 4:
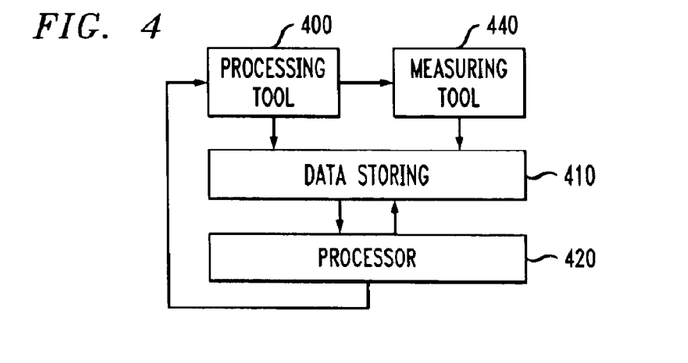
FIG. 4 illustrates an exemplary system for analyzing a semiconductor manufacturing process in accordance with the present invention.

FIG. 4 illustrates an exemplary system for analyzing a semiconductor manufacturing process in accordance with one embodiment of the present invention. The system includes a processing tool 400, a measuring tool 440, a processor 420, and a data storing means 410.

The processing tool 400 can perform a semiconductor fabrication process by receiving the set of input data mentioned in FIG. 2. The tool 400 can be, for example, a furnace, etcher, chemical-mechanical polish (CMP) tool, or any other manufacturing tool. In one embodiment of thermal diffusion, the processing tool is a vertical furnace with five heating zones. In this embodiment, the set of input data can be, for example, temperature, pressure, gas flow rate, or any other factors that affect the manufacturing process.

The measuring tool 440 can create the set of output data mentioned above with reference to FIG. 2. The measuring tool 440 can be a thickness measuring tool, such as an ellipsometer. In one embodiment of thermal diffusion, the set of output data can be thickness of a thin film layer formed by the thermal diffusion process or the thickness variations The data storing means 410 can collect the sets of input and output data, transformed data, eigvenvalues and eigenvectors, principal components, principal scores and any relationships mentioned in FIGS. 2 and 3. Detailed descriptions of these data are not repeated. The data storing means 410 can be tangible media, such as floppy diskettes, read only memories (ROMs), CD-ROMs, hard drives, $ZIP_{TM}$ disks, memory sticks, or any other computer-readable storage medium. There is no requirement that these data or relationships be stored in the same storing means. One of ordinary skill in the art will understand that whether these data should be stored in the same storing means depends on efficiency of the system and complexity of combining these data in the same storing means. Therefore, these data can be stored separately in different storing means, or more than two of them can be stored in the same storing means.

The processor 420 can perform the analysis steps 310 and 320, prediction step 330, transforming step 340, comparing step 350, and noise filtering step 360 mentioned above with respect to FIG. 3. The processor 420 can be a digital signal processor, a central processing unit (CPU), a computer, a workstation or any other related signal processor that can substantially perform the same function of the processor 420. Moreover, the processor 420 can also feed back the new predicted input and output data to the storing means 410 and the processing tool 400 for processing subsequent substrates.

It is not necessary that the functions performed by the processor 420 be implemented in the same processor. These functions also can be performed separately and selectively implemented in more than one processor. One of ordinary skill in the art will understand that whether performing these functions in the same processor is advantageous depends on efficiency of the system and complexity of connection of different processors.

Although the processing tool 400, the data storing means 410, the processor 420 and the measuring tool 440 are separate as shown in FIG. 4, it is possible that two or three of the three elements can be combined or connected in one system. For example, the data storing means in the processor 420 can be combined together; therefore, the operation efficiency of the system can be improved. In addition, different storing means and processors may be embedded in the processing tool 400 or measuring tool 440. Accordingly, one of ordinary skill in the art understand that whether these elements should be combined in the same or different tools depends on operation efficiency of the system and complexity of connection of the different elements.

EXAMPLE

Following are the steps of an exemplary embodiment for determining a relationship between temperature differences of each temperature zone and thickness variations of a thin film layer. First, the collection step 300 can collect the sets of input and output data. The exemplary embodiment is a thermal diffusion process to form a silicon nitride layer in a vertical furnace by chemical vapor deposition (CVD). The vertical furnace has five temperature zones and three different regions, for example, top, center and bottom, and can form different thicknesses of the nitride layer. Of course, the furnace can have more than three regions. A theoretical temperature and a theoretical thickness of the nitride layer are 780 ° C and 1625 A, respectively. The input data are the temperature differences between the theoretical temperature and real temperatures in each temperature zone. The output data are the thickness differences between the theoretical thickness and the real thicknesses formed in each region. The sets of input and output data are randomly selected from a huge data base and shown in Table 1, wherein Obs represents different manufacturing runs, $\Delta T$ represents different temperature variations of each temperature zone, and $\Delta y$ represents thickness differences of the silicon nitride layer in each region of the furnace.

TABLE 1

| Obs | $\Delta T_1$ | $\Delta T_2$ | $\Delta T_3$ | $\Delta T_4$ | $\Delta T_5$ | $\Delta y_u$ | $\Delta y_c$ | $\Delta y_l$ |
|---|---|---|---|---|---|---|---|---|
| 1 | 0 | −0.4 | 0 | −0.8 | 0 | −3.1778 | −8.9111 | −17.4333 |
| 2 | 0 | 0.1 | 0 | −0.2 | −0.7 | −13.6889 | 0.1667 | −0.5 |
| 3 | −0.3 | −0.3 | −0.7 | 0 | 0 | 5.6 | −14.7778 | −10.8778 |
| 4 | −0.3 | −0.3 | −0.3 | −0.3 | −0.2 | 0.0444 | −5.9222 | −6.6111 |
| 5 | 0.1 | 0.1 | −0.2 | −0.4 | −0.2 | −3.2889 | −7.1778 | 7.1778 |
| 6 | −0.5 | 0 | −0.1 | −0.9 | −0.7 | 0.4667 | 7.5667 | 7.6333 |
| 7 | −0.2 | −0.2 | −0.3 | 0.5 | 0.1 | 8.9444 | 3.3222 | −3.4222 |
| 8 | −0.1 | −0.3 | −0.7 | −0.5 | −0.1 | 5.7111 | −19.0778 | −11.0778 |
| 9 | 0 | 0 | 0 | −0.4 | −0.5 | −16.0222 | −4.7111 | −3.6556 |
| 10 | −0.1 | −0.1 | 0.2 | −0.1 | −0.1 | −6.3 | 6.0222 | −9.5111 |
| 11 | −0.4 | −0.4 | 0.3 | −0.3 | −0.3 | 4.6778 | 13.2889 | −12.5333 |
| 12 | 0 | 0 | −0.2 | −0.2 | −0.2 | −8.1222 | −10.4333 | −1.1667 |
| 13 | 0.3 | 0.3 | 0.3 | 0.1 | 0 | −23.1111 | 11.9 | 23.6444 |
| 14 | −0.2 | −0.2 | −0.1 | 0 | 0 | 13.8444 | −5.1222 | −10.4667 |
| 15 | 0.1 | 0.1 | 0 | 0.4 | 0.4 | 34.2333 | 19.6333 | 2.2889 |
| 16 | 0 | 0 | −0.4 | 0 | 0.1 | 12.3556 | −7.1556 | −7.6778 |
| 17 | −0.5 | −0.5 | 0.1 | 0.1 | 0.1 | 11.2 | 7.7444 | −16.4556 |
| 18 | 0 | 0 | −0.6 | −0.1 | −0.1 | 14.0333 | −13.0889 | −4.4667 |
| 19 | 0.3 | 0.3 | 0.1 | 0.1 | 0.1 | −18.5 | −2.7444 | 22.2556 |
| 20 | −0.5 | −0.5 | −0.3 | 0 | 0 | 17.9778 | −8.2333 | −30.2222 |

In accordance with the transforming step 240, the Arrhenius model as mentioned in equation (4) can transform the sets of input and output data into transformed sets of input and output data. Table 2 shows the transformed input and output data.

TABLE 2

| Obs | $\Delta T_1$ | $\Delta T_2$ | $\Delta T_3$ | $\Delta T_4$ | $\Delta T_5$ | $\ln\Delta y_u$ | $\ln\Delta y_c$ | $\ln\Delta y_l$ |
|---|---|---|---|---|---|---|---|---|
| 1  | 0     | 4E−07  | 0      | 7E−07  | 0      | −0.00192 | −0.00543 | −0.01062 |
| 2  | 0     | −1E−07 | 0      | 2E−07  | 6E−07  | −0.00824 | 1E−04    | −0.00031 |
| 3  | 3E−07 | 3E−07  | 7E−07  | 0      | 0      | 0.003394 | −0.0089  | −0.00658 |
| 4  | 3E−07 | 3E−07  | 3E−07  | 3E−07  | 2E−07  | 2E−05    | −0.0036  | −0.00403 |
| 5  | −1E−07| −1E−07 | 2E−07  | 4E−07  | 2E−07  | −0.00199 | −0.00438 | 0.00438  |
| 6  | 5E−07 | 0      | 1E−07  | 8E−07  | 6E−07  | 0.00028  | 0.004609 | 0.004639 |
| 7  | 2E−07 | 2E−07  | 3E−07  | −5E−07 | −1E−07 | 0.005425 | 0.002018 | −0.00208 |
| 8  | 1E−07 | 3E−07  | 7E−07  | 5E−07  | 1E−07  | 0.003454 | −0.0116  | −0.00675 |
| 9  | 0     | 0      | 0      | 4E−07  | 5E−07  | −0.00972 | −0.00288 | −0.00223 |
| 10 | 1E−07 | 1E−07  | −2E−07 | 1E−07  | 1E−07  | −0.00383 | 0.003673 | −0.00581 |
| 11 | 4E−07 | 4E−07  | −3E−07 | 3E−07  | 3E−07  | 0.002856 | 0.008157 | −0.00764 |
| 12 | 0     | 0      | 2E−07  | 2E−07  | 2E−07  | −0.00493 | −0.00635 | −0.00071 |
| 13 | −3E−07| −3E−07 | −3E−07 | −1E−07 | 0      | −0.01415 | 0.007244 | 0.014278 |
| 14 | 2E−07 | 2E−07  | 1E−07  | 0      | 0      | 0.008504 | −0.00311 | −0.0063  |
| 15 | −1E−07| −1E−07 | 0      | −4E−07 | −4E−07 | 0.021125 | 0.011958 | 0.001399 |
| 16 | 0     | 0      | 4E−07  | 0      | −1E−07 | 0.007541 | −0.00435 | −0.00468 |
| 17 | 5E−07 | 5E−07  | −1E−07 | −1E−07 | −1E−07 | 0.006787 | 0.004699 | −0.00999 |
| 18 | 0     | 0      | 6E−07  | 1E−07  | 1E−07  | 0.008504 | −0.00792 | −0.00274 |
| 19 | −3E−07| −3E−07 | −1E−07 | −1E−07 | −1E−07 | −0.01122 | −0.00167 | 0.013597 |
| 20 | 5E−07 | 5E−07  | 3E−07  | 0      | 0      | 0.0109   | −0.00498 | −0.01845 |

From Tables 1 and 2, although the differences between original and transformed input data of temperature differences of each temperature zone are by seven orders of magnitude, the values of the original and transformed data have the same coefficient. For example, in Run 2 the original and transformed temperature difference of the second temperature zone are 0.1 and 1E−7, respectively. Because of no variance of the coefficient, a linear mathematical model having a form similar to the Arrhenius Model can determine the relationship between the temperature and thickness variations as shown in Equation (4).

Table 3 shows a normalized input data of temperature difference of each temperature zone created from Table 1.

TABLE 3

| Obs | temp1 | temp2 | temp3 | temp4 | temp5 |
|---|---|---|---|---|---|
| 1  | 0.47250  | −1.17098 | 0.48626  | −1.87229 | 0.42282  |
| 2  | 0.47250  | 0.88337  | 0.48626  | −0.14402 | −2.15089 |
| 3  | −0.76011 | −0.76011 | −1.86119 | 0.43207  | 0.42282  |
| 4  | −0.76011 | −0.76011 | −0.51979 | −0.43207 | −0.31252 |
| 5  | 0.88337  | 0.88337  | −0.18444 | −0.72011 | −0.31252 |
| 6  | −1.58185 | 0.47250  | 0.15091  | −2.16033 | −2.15089 |
| 7  | −0.34924 | −0.34924 | −0.51979 | 1.87229  | 0.79050  |
| 8  | 0.06163  | −0.76011 | −1.86119 | −1.00815 | 0.05515  |
| 9  | 0.47250  | 0.47250  | 0.48626  | −0.72011 | −1.41554 |
| 10 | 0.06163  | 0.06163  | 1.15696  | 0.14402  | 0.05515  |
| 11 | −1.17098 | −1.17098 | 1.49231  | −0.43207 | −0.68019 |
| 12 | 0.47250  | 0.47250  | −0.18444 | −0.14402 | −0.31252 |
| 13 | −1.58185 | −1.58185 | −0.51979 | 0.43207  | 0.42282  |
| 14 | 1.70511  | 1.70511  | 1.49231  | 0.72011  | 0.42282  |
| 15 | −0.34924 | −0.34924 | 0.15091  | 0.43207  | 0.42282  |
| 16 | 0.88337  | 0.88337  | 0.48626  | 1.58424  | 1.89351  |
| 17 | 0.47250  | 0.47250  | −0.85514 | 0.43207  | 0.79050  |
| 18 | −1.58185 | −1.58185 | 0.82161  | 0.72011  | 0.79050  |
| 19 | 0.47250  | 0.47250  | −1.52584 | 0.14402  | 0.05515  |
| 20 | 1.70511  | 1.70511  | 0.82161  | 0.72011  | 0.79050  |

The normalized input data serve for generating eigenvalues and eigenvectors for the subsequent analysis steps. However, there is no requirement that the normalization of the input data be performed. In some embodiments, the row data can serve for generating eigenvalues and eigenvectors for the subsequent analysis steps.

Then the first analysis step 210 can determine principal components that dominate the reaction of the thermal diffusion process from the set of input data by PCA. Table 4 shows the correlation coefficients between the set of input data. In addition, Tables 5 and 6 show a set of eigenvalues and eigenvectors respectively. The correlation coefficients represent the strength of the linear relationship between some variables. The higher the correlation coefficients, the more linear a relationship they have.

TABLE 4

|  | $\Delta T_1$ | $\Delta T_2$ | $\Delta T_3$ | $\Delta T_4$ | $\Delta T_5$ |
|---|---|---|---|---|---|
| $\Delta T_1$ | 1       | 0.79565  | 0.16425  | 0.17752 | 0.21109  |
| $\Delta T_2$ | 0.79565 | 1        | 0.22952  | 0.14638 | −0.10694 |
| $\Delta T_3$ | 0.16425 | 0.22952  | 1        | 0.03305 | −0.09961 |
| $\Delta T_4$ | 0.17752 | 0.14638  | 0.03305  | 1       | 0.66609  |
| $\Delta T_5$ | 0.21109 | −0.10694 | −0.09961 | 0.66609 | 1        |

Table 5 shows the eigenvalues of the correlation matrix, differences of the eigenvalues, the proportion of the eigenvalues and the cumulative sum of the proportions. The proportion is each eigenvalue over the sum of the eigenvalues.

TABLE 5

| Variable | Eigenvalue | Difference | Proportion | Cumulative Sum |
|---|---|---|---|---|
| 1 | 2.00657524 | 0.41160858 | 0.4013 | 0.4013 |
| 2 | 1.59496666 | 0.69318994 | 0.3190 | 0.7203 |
| 3 | 0.90177672 | 0.50197924 | 0.1804 | 0.9007 |
| 4 | 0.39979748 | 0.30291357 | 0.0800 | 0.9806 |
| 5 | 0.09688390 |            | 0.0194 | 1.0000 |

From Table 5, the eigenvalues of variables 4 and 5 are smaller than those of the others. Accordingly, the variables 4 and 5 can be ignored in the following steps to reduce the complexities of the algorithm. In addition, the eigenvectors of the correlation matrix are shown in Table 6.

TABLE 6

|  | Prin 1 | Prin 2 | Prin 3 | Prin 4 | Prin 5 |
|---|---|---|---|---|---|
| $\Delta T_1$ | 0.614253 | -0.226078 | -0.267456 | 0.399860 | -0.583233 |
| $\Delta T_2$ | 0.558698 | -0.399020 | -0.209778 | -0.330453 | 0.612727 |
| $\Delta T_3$ | 0.209520 | -0.294138 | 0.921534 | 0.142358 | 0.009686 |
| $\Delta T_4$ | 0.406873 | 0.538069 | 0.182291 | -0.646246 | -0.306713 |
| $\Delta T_5$ | 0.317972 | 0.643146 | 0.044781 | 0.541307 | 0.436163 |

Then the first analysis step 210 can determine a set of principal component scores. Based on the eigenvectors, a linear relationship between the variables and the temperature differences of each temperature zone can be generated. For example, Prin 1=$0.614253\Delta T_1+0.558698\Delta T_2+0.209520\Delta T_3+0.406873\Delta T_4+0.317972\Delta T_5$ where $\Delta T_1$, $\Delta T_2$, $\Delta T_3$, $\Delta T_4$ and $\Delta T_5$, are the temperature variations of each temperature zone.

The principal component score data are generated from the linear relationship shown above. Table 7 shows the set of principal component scores.

TABLE 7

| Obs | prin1 | prin 2 | prin 3 | prin 4 | prin 5 |
|---|---|---|---|---|---|
| 1 | -0.88944 | -0.51809 | -0.24501 | -2.08394 | -0.22968 |
| 2 | 0.14313 | -2.06316 | -0.01384 | 1.10497 | -0.62357 |
| 3 | -0.97128 | 1.52701 | 1.2547 | 0.36806 | 0.011453 |
| 4 | -1.27565 | 0.19455 | 0.20901 | 0.0167 | -0.03124 |
| 5 | 0.60514 | -1.08641 | 0.73681 | -0.33125 | 0.108824 |
| 6 | -2.23895 | -2.42104 | 0.02711 | 0.53536 | 0.938028 |
| 7 | 0.49459 | 1.88702 | -0.06436 | 0.88029 | -0.24481 |
| 8 | -1.16942 | 0.32983 | 1.75349 | -0.69224 | -0.18644 |
| 9 | -0.087 | -1.73625 | -0.02795 | 0.19886 | -0.37789 |
| 10 | 0.39083 | -0.26587 | -1.06549 | -0.10576 | -0.00709 |
| 11 | -1.45291 | -0.37691 | -1.82482 | -0.04219 | -0.18424 |
| 12 | 0.3576 | -0.5196 | 0.43571 | 0.06956 | -0.07999 |
| 13 | -1.65409 | -0.3736 | -0.372 | 0.23413 | 0.000211 |
| 14 | 2.74012 | -0.8454 | -0.71168 | -0.0943 | 0.028297 |
| 15 | -0.06778 | 0.67834 | -0.40343 | 0.0531 | 0.043061 |
| 16 | 2.3847 | 1.37502 | -0.40012 | -0.1317 | 0.370736 |
| 17 | 0.8022 | 0.69706 | 0.89937 | -0.05974 | 0.217917 |
| 18 | -1.13894 | 1.64302 | -1.67872 | 0.0303 | 0.085222 |
| 19 | 0.31066 | 0.26641 | 1.60288 | 0.24764 | -0.02096 |
| 20 | 2.7165 | -0.41165 | -0.11007 | -0.19784 | 0.182165 |

The second analysis step 320 then determines a relationship between the principal components and the thickness variance of the silicon nitride layer in the different regions of the furnace. From the principal component scores shown in Table 7 and the set of output data, i.e. the thickness variance of the silicon nitride layer in the different regions of the furnace, shown in Table 1, regression model can generate a relationship between the output data and the principal components. Table 8 shows the relationship between the set of output data and the principal components.

TABLE 8

|  | Intercept | Prin 1 | Prin 2 | Prin 3 | $R^2$ |
|---|---|---|---|---|---|
| $\Delta y_u$ | 1.84388 |  | 7.77388 |  | 0.4940 |
| $\Delta y_c$ | -1.88566 |  |  | 8.33008 | 0.5943 |
| $\Delta y_l$ | -4.1539 | 6.29253 | -4.83259 |  | 0.7248 |

The blank cells shown in Table 8 mean that the values of the relationship are so low as to be negligible. From Table 8, a linear relationship between the output data and principal components can be shown, for example, as below:

$\Delta y_u$=1.84388+7.77388 Prin 2

Moreover, the R-square values can determine whether too much process noise are included in the randomly selected sets of input and output data. The R-square values can also determine whether the noise filtering step 360 is required. When the R-square values are near to 1, less process noise is encounter.

Finally, Table 9 shows a relationship between the sets input and output data generated by multiplying the matrix Table 8 with Table 6.

TABLE 9

|  | Intercept | $\Delta T_1$ | $\Delta T_2$ | $\Delta T_3$ | $\Delta T_4$ | $\Delta T_5$ |
|---|---|---|---|---|---|---|
| $\Delta y_u$ | 2.357 | -7.22 | -12.74 | -7.67 | 12.05 | 18.38 |
| $\Delta y_c$ | 0.783 | -9.15 | -7.18 | 25.74 | 4.37 | 1.37 |
| $\Delta y_l$ | 1.608 | 20.37 | 22.37 | 9.19 | -0.12 | -4.08 |

Accordingly, a relationship between the original input and output data can be generated.

From R-square values shown in Table 8, the noise filtering step 360 is required to reduce the process noise. The filtering step 360 can reduce data noise by DOE. After DOE generates another set of input and output data from the data base, the first analysis step 310 and the second analysis step 320 can create a new relationship shown in Table 10. The new R-square values are near to 1 and, therefore, the steps of finding the relationship between the input and output data are done.

TABLE 10

|  | Intercept | $\Delta T_1$ | $\Delta T_2$ | $\Delta T_3$ | $\Delta T_4$ | $\Delta T_5$ | $R^2$ |
|---|---|---|---|---|---|---|---|
| $\Delta y_u$ | 0.743 | -1.21 | -2.58 | -7.11 | 4.92 | 18.44 | 0.971 |
| $\Delta y_c$ | 14.746 | -1.03 | -5.36 | 24.99 | 6 | -0.88 | 0.978 |
| $\Delta y_l$ | -12.794 | 8.78 | 22.0 | -0.7 | 1.26 | -0.44 | 0.956 |

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method for analyzing a semiconductor manufacturing process, comprising:
   (a) generating sets of input and output data from the semiconductor manufacturing process;
   (b) determining principal components from the set of input data by Principal Component Analysis (PCA) and determining a set of principal component score data by multiplying the set of input data by parameters describing a relationship between the principal components and the input data; and
   (c) determining a relationship between the sets of input and output data from the set of principal component score data and the set of output data.

2. The method of claim 1, further comprising feeding back the relationship to the semiconductor process to predict sets of new input and output data.

3. The method of claim 1, wherein the step (a) comprises generating the input and output data from a thermal diffusion process.

4. The method of claim 3, further comprising performing the thermal diffusion process in a vertical furnace.

5. The method of claim 4, wherein the set of input data comprise different zone temperatures in the vertical furnace.

6. The method of claim 4, wherein the set of output data comprise thicknesses of a thin film layer formed by the thermal diffusion process.

7. The method of claim 1, further comprising transforming the sets of input and output data into sets of transformed input and output data by a model.

8. The method of claim 7, further comprising comparing the sets of input and output data with the sets of transformed input and output data.

9. The method of claim 7, wherein the model is an Arrhenius model.

10. The method of claim 1, wherein the step (c) comprises applying a regression model to determine the relationship.

11. The method of claim 10, wherein the regression model comprises a linear regression model.

12. The method of claim 1, further comprising applying design of experiment (DOE) to generate the set of input and output data.

13. A method for analyzing a thermal diffusion process in a vertical furnace, comprising:
   (a) generating sets of input and output data from the thermal diffusion process by design of experiment (DOE) techniques;
   (b) determining principal components from the sets of input data by Principal Component Analysis (PCA) and determining a set of principal component score data by multiplying the set of input data by parameters describing a relationship between the principal components and the input data; and
   (c) determining a relationship between the sets of input and output data from the set of principal component score data and the set of output data.

14. The method of claim 13, wherein said determining a relationship further comprises filtering noise within the sets of input and output data and feeding back the relationship to the semiconductor process for predicting sets of new input and output data.

15. The method of claim 13, wherein the set of input data comprise different zone temperatures in the vertical furnace.

16. The method of claim 13, wherein the set of output data comprise thicknesses of a thin film layer formed by the thermal diffusion process.

17. The method of claim 13, further comprising transforming the sets of input and output data into sets of transformed input and output data by a model.

18. The method of claim 17, further comprising comparing the sets of input and output data with the sets of transformed input and output data.

19. The method of claim 17, wherein the model is an Arrhenius model.

20. The method of claim 13, wherein the set of principal component score data comprise principal component scores.

21. The method of claim 13, wherein the step (c) comprises applying a regression model to determine the relationship.

22. The method of claim 21, wherein the regression model comprises a linear regression model.

23. A method for analyzing a thermal diffusion process in a vertical furnace, comprising:
   (a) generating a set of input data having different zone temperatures in the vertical furnace and a set of output data having thicknesses of a thin film layer by design of experiment (DOE) techniques;
   (b) transforming the sets of input and output data into sets of transformed input and output data by an Arrhenius model;
   (c) comparing the sets of input and output data with the sets of transformed input and output data;
   (d) determining principal components from the sets of input data by Principal Component Analysis (PCA) and determining a set of principal component score data by multiplying the set of input data by parameters describing a relationship between the principal components and the input data;
   (e) determining a relationship between the sets of input and output data from the set of principal component scores and the set of output data by a linear regression model; and
   (f) feeding back the relationship to the semiconductor process to predict sets of new input and output data.

24. A system for analyzing a thermal diffusion process in a vertical furnace, comprising:
   at least one storing means adapted to store sets of input data and output data from a semiconductor manufacturing process; and
   at least one processor coupled to the storing means, adapted to determine principal components from the sets of input data by Principal Component Analysis (PCA) and to determine a set of principal component score data by multiplying the set of input data by parameters describing a relationship between the principal components and the input data, and further adapted to determine a relationship between the sets of input and output data from the set of principal component score data and the set of output data.

25. The system of claim 24, wherein the processor further is adapted to feed back the relationship to the storing means, and predicts sets of new input and output data.

26. The system of claim 24, wherein the set of input data comprise different zone temperatures in the vertical furnace.

27. The system of claim 24, wherein the set of output data comprise thicknesses of a dielectric layer formed by the thermal diffusion process.

28. The system of claim 24, wherein the processor further is adapted to transform the sets of input and output data into sets of transformed input and output data by a model.

29. The system of claim 28, wherein the processor further is adapted to compare the sets of input and output data with the sets of transformed input and output data.

30. The system of claim 28, wherein the model is an Arrhenius model.

31. The system of claim 24, wherein the processor is adapted to determine the relationship by using a regression model.

32. The system of claim 31, wherein the regression model comprises a linear regression model.

33. The system of claim 24, where the sets of input and output data are generated by design of experiment (DOE).

34. A method for analyzing a semiconductor manufacturing process, comprising:
   (a) generating sets of input and output data from the semiconductor manufacturing process;
   (b) determining principal components from the set of input data by Principal Component Analysis (PCA) and determining a set of principal component score data based on the principal components;
   (c) determining a relationship between the sets of input and output data from the set of principal component score data and the set of output data;
   (d) filtering noise within the sets of input and output data to determine a filtered relationship; and
   (e) feeding back the filtered relationship to the semiconductor process to predict sets of new input and output data.

35. A system for analyzing a thermal diffusion process in a vertical furnace, comprising:
- at least one storing means adapted to store sets of input data and output data from a semiconductor manufacturing process; and
- at least one processor coupled to the storing means, adapted to: determine principal components from the sets of input data by Principal Component Analysis (PCA); to determine a set of principal component score data based on the principal components; to determine a relationship between the sets of input and output data from the set of principal component score data and the set of output data; to filter noise within the sets of input and output data and determine a filtered relationship; and to feed back the filtered relationship to the semiconductor process to predict sets of new input and output data.

* * * * *

UNITED STATES PATENT AND TRADEMARK OFFICE
CERTIFICATE OF CORRECTION

| | |
|---|---|
| PATENT NO. | : 6,993,407 B2 |
| APPLICATION NO. | : 10/677929 |
| DATED | : January 31, 2006 |
| INVENTOR(S) | : Chong I. Sun |

Page 1 of 1

It is certified that error appears in the above-identified patent and that said Letters Patent is hereby corrected as shown below:

Column 4, line 12, delete --By-- and insert --By the creation--.

Column 5, line 32, delete --difflusion-- and insert --diffusion--,

Column 8, line 1, delete --in-- and insert --410 and--.

Column 8, line 6, delete --understand-- and insert --understands--.

Column 9, line 2, delete --equation-- and insert --Equation--.

Column 11, line 50, delete --regression-- and insert --a regression--,

Column 13, line 2 of claim 5, delete --furnace-- and insert --furnace--.

Signed and Sealed this

Twenty-second Day of August, 2006

JON W. DUDAS
*Director of the United States Patent and Trademark Office*